(12) United States Patent
Tokunaga

(10) Patent No.: US 10,070,089 B2
(45) Date of Patent: Sep. 4, 2018

(54) INVERTING AMPLIFIER, INTEGRATOR, SAMPLE HOLD CIRCUIT, AD CONVERTER, IMAGE SENSOR, AND IMAGING APPARATUS

(71) Applicant: PANASONIC INTELLECTUAL PROPERTY MANAGEMENT CO., LTD., Osaka (JP)

(72) Inventor: Yusuke Tokunaga, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/453,372

(22) Filed: Mar. 8, 2017

(65) Prior Publication Data

US 2017/0272674 A1  Sep. 21, 2017

(30) Foreign Application Priority Data

Mar. 16, 2016  (JP) .................................. 2016-051846

(51) Int. Cl.

| | |
|---|---|
| *H04N 5/378* | (2011.01) |
| *H04N 5/374* | (2011.01) |
| *H03K 5/08* | (2006.01) |
| *H03F 1/22* | (2006.01) |
| *G11C 27/02* | (2006.01) |
| *H03M 1/12* | (2006.01) |

(52) U.S. Cl.

CPC ............ *H04N 5/378* (2013.01); *G11C 27/026* (2013.01); *H03F 1/223* (2013.01); *H03K 5/08* (2013.01); *H03M 1/1245* (2013.01); *H04N 5/374* (2013.01)

(58) Field of Classification Search

CPC ...... H03M 1/124–1/1295; G11C 27/02; G11C 27/024; G11C 27/026; H04N 5/3745–5/37455; H04N 5/378; H03K 5/01; H03K 5/02–5/026; H03K 5/08–5/088

See application file for complete search history.

(56) References Cited

U.S. PATENT DOCUMENTS

| | | | |
|---|---|---|---|
| 4,431,929 A | 2/1984 | Vittoz | |
| 7,915,933 B2 * | 3/2011 | Vlasenko | ................ H02M 1/34 327/157 |

FOREIGN PATENT DOCUMENTS

JP  02-006453 B2  2/1990

OTHER PUBLICATIONS

Y. Chae, et al. "A 2.1 M Pixels, 120 Frame/s CMOS Image Sensor with Column-Parallel DS ADC Architecture," IEEE Journal of Solid-State Circuits, Vo. 46, No. 1, pp. 236-247. Jan. 2011.

* cited by examiner

*Primary Examiner* — Paul Berardesca

(74) *Attorney, Agent, or Firm* — McDermott Will & Emery LLP

(57) ABSTRACT

An inverting amplifier includes an input terminal, an output terminal, a PMOS transistor, another PMOS transistor, an NMOS transistor, another NMOS transistor, and a clamp circuit. The PMOS transistors are connected in series between a supply voltage and an output terminal. The NMOS transistors are connected in series between a ground voltage and the output terminal. The clamp circuit is connected to the gate of the other PMOS transistor and the gate of the other NMOS transistor. The clamp circuit includes a switch, a capacitor, another switch, and another capacitor. At least one of the gate of the PMOS transistor and the gate of the NMOS transistor is connected to the input terminal.

11 Claims, 12 Drawing Sheets

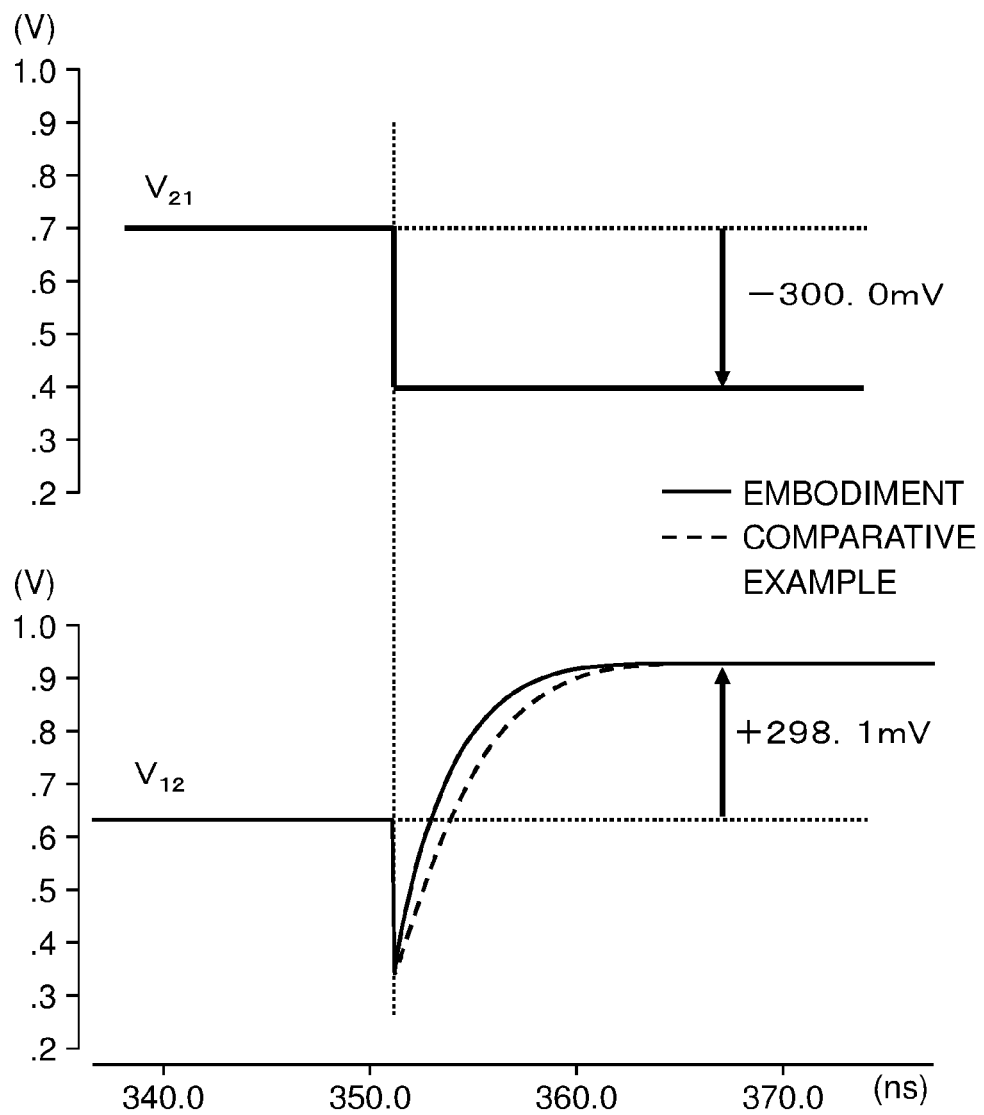

INVERTING AMPLIFIER, INTEGRATOR, SAMPLE HOLD CIRCUIT, AD CONVERTER, IMAGE SENSOR, AND IMAGING APPARATUS

RELATED APPLICATION

This application claims the benefit of Japanese Application No. 2016-051846, filed on Mar. 16, 2016, the disclosure of which Application is incorporated by reference herein.

BACKGROUND

1. Technical Field

The present disclosure relates to an inverting amplifier, an integrator, a sample hold circuit, an AD converter, an image sensor, and an imaging apparatus.

2. Description of Related Art

Inverter circuits have often been used as high-speed compact inverting amplifiers. For example, inverter circuits have been used as amplifiers of integrators applied to $\Delta\Sigma$AD converters in the field of image sensors (for example, see Non-patent Literature 1).

Non-patent literature 1: Y. Chae, et al., "A 2.1 M Pixels, 120 Frames/s CMOS Image Sensor With Column-Parallel $\Delta\Sigma$ADC Architecture," IEEE J. Solid-State Circuits, vol. 46, no. 1, pp. 236-247, January 2011.

SUMMARY

An inverting amplifier according to the present disclosure includes a first input terminal, a first output terminal, a first transistor, a second transistor, a third transistor, a fourth transistor, and a clamp circuit. The first input terminal is an input terminal to which an input signal is input. The first output terminal is an output terminal from which an output signal is output. The first transistor and the second transistor have a first polarity and are connected in series between a first voltage node and the first output terminal. The third transistor and the fourth transistor have a second polarity and are connected in series between a second voltage node and the first output terminal. The clamp circuit is connected to the gate of the second transistor and the gate of the fourth transistor. The second transistor and the fourth transistor are connected to the first output terminal. The clamp circuit includes a first switch, a first capacitor, a second switch, and a second capacitor.

The first switch is connected between a third voltage node and the gate of the second transistor. The first capacitor is connected between the first input terminal and the gate of the second transistor. The second switch is connected between a fourth voltage node and the gate of the fourth transistor. The second capacitor is connected between the first input terminal and the gate of the fourth transistor. The first input terminal and at least one of the gate of the first transistor and the gate of the third transistor are connected to allow an input signal to pass through.

The inverting amplifier according to the present disclosure is effective for inversely amplifying an input signal at high speed.

BRIEF DESCRIPTION OF DRAWINGS

FIG. 2 is a graph showing examples of output waveforms before and after rises of input signals in an integrator in a comparative example and in the integrator according to Embodiment 1.

DETAILED DESCRIPTION

Figure 1A:
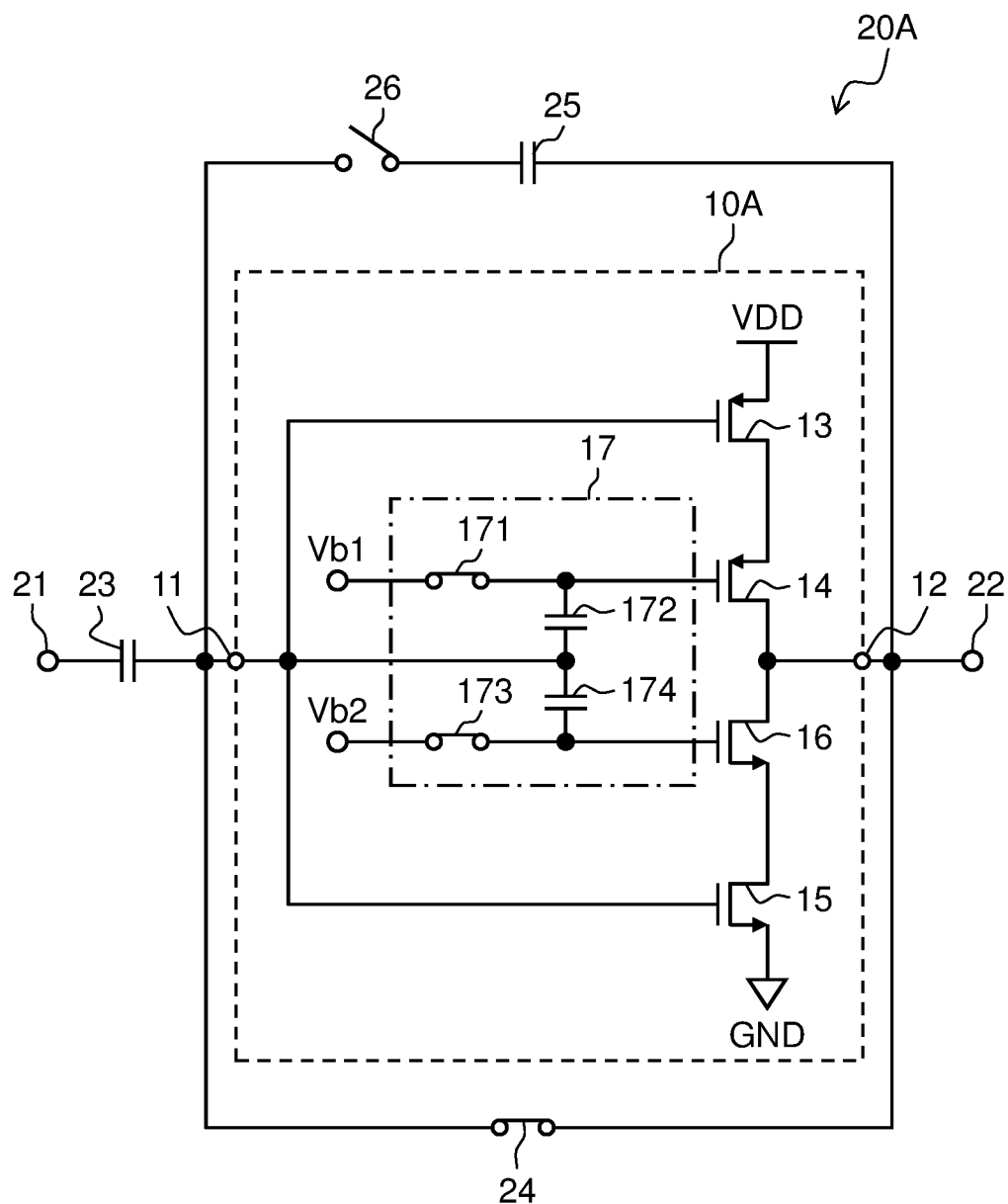
FIG. 1A is a circuit diagram illustrating an example of an integrator in a sampling phase which includes an inverting amplifier according to Embodiment 1.

Hereinafter, embodiments are described in detail arbitrarily referring to the drawings. It is to be noted that excessively detailed descriptions may be omitted. For example, detailed descriptions of already well-known matters, overlapping descriptions for substantially the same configuration may be omitted. This omission is made to prevent the descriptions below from being too redundant, and help a person skilled in the art to understand the present disclosure. It is to be noted that the drawings and descriptions below are provided to help the person skilled in the art to fully appreciate the present disclosure. Therefore, the inventors do not intend to limit the subject matters of the claims to the drawings and descriptions.

Embodiment 1

Hereinafter, Embodiment 1 is described with reference to FIGS. 1A, 1B, 2, and 3.

[1-1. Configuration]

Figure 9:
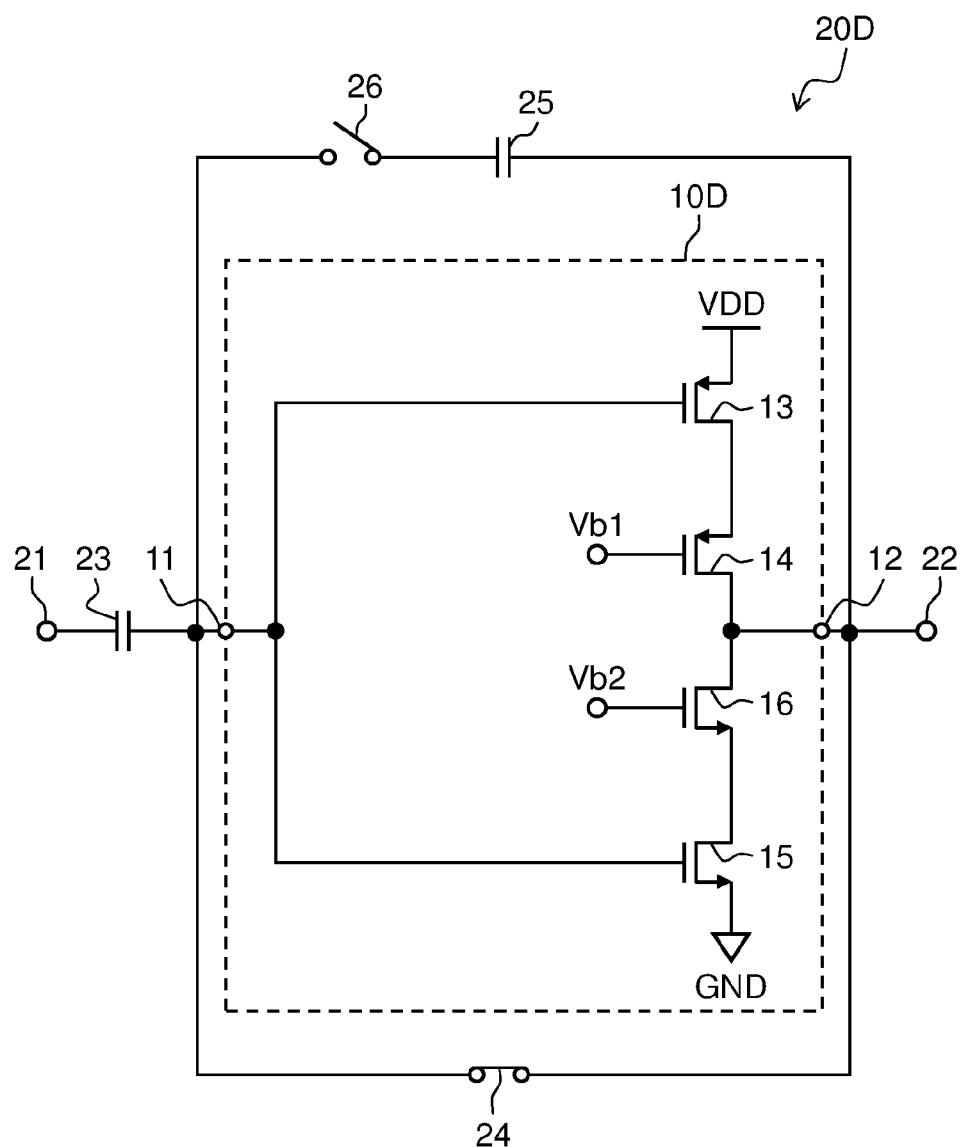
FIG. 9 is a circuit diagram illustrating an example of an integrator including an inverting amplifier which does not include any clamp circuit.

FIG. 9 illustrates a circuit diagram of integrator 20D including inverting amplifier 10D which does not include clamp circuit 17 that is described later. In general, a gain of an inverting amplifier configured with an inverter circuit is approximately 30 dB. Inverting amplifier 10D includes cascode transistors (PMOS transistor 14 and NMOS transistor 16), and thus is capable of obtaining a gain higher by approximately 20 to 30 dB than a gain obtainable by the inverting amplifier configured with the inverter circuit. On the other hand, in inverting amplifier 10D, the cascode transistors limit current that flows from supply voltage VDD to output terminal 12 of inverting amplifier 10D and current that flows from output terminal 12 to ground voltage GND. In other words, inverting amplifier 10D including the cascode transistors has a reduced drive power for driving a load connected to output terminal 12. This causes degradation in large-signal characteristics of integrator 20D. As an example of caused problems, settling time required for an output from integrator 20D to be constant is increased.

Figure 1B:
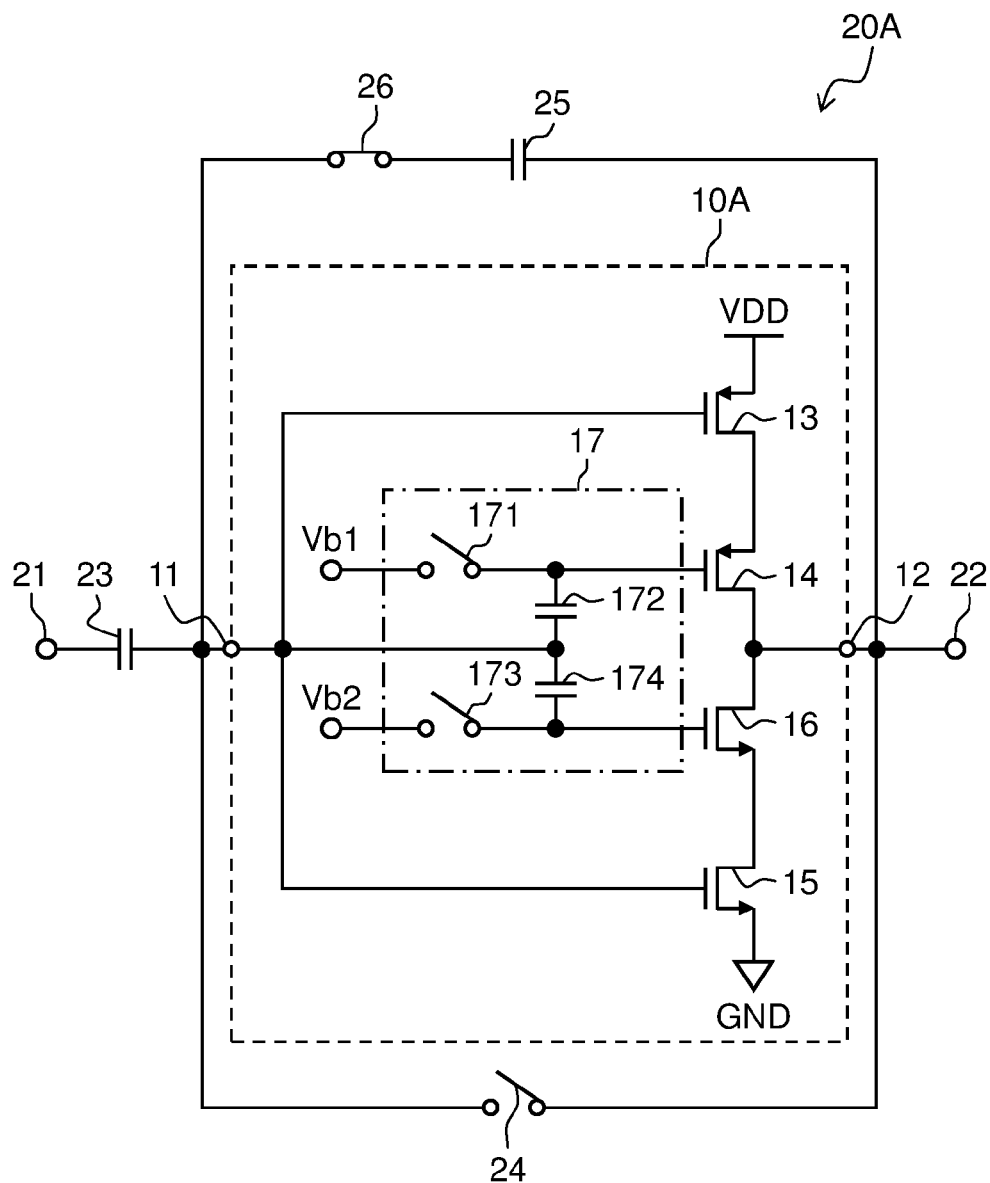
FIG. 1B is a circuit diagram illustrating the integrator in FIG. 1A in an integration phase.

Each of FIGS. 1A and 1B illustrates an example of the integrator including the inverting amplifier according to Embodiment 1. The integrator has, a sampling phase and an integration phase as operating states. FIG. 1A is a circuit diagram illustrating the integrator in the sampling phase. FIG. 1B is a circuit diagram illustrating the integrator in the integration phase.

As illustrated in FIGS. 1A and 1B, inverting amplifier 10A includes input terminal 11, output terminal 12, two PMOS transistors 13 and 14, two NMOS transistors 15 and 16, and clamp circuit 17. Two PMOS transistors 13 and 14 are connected in series between supply voltage VDD and output terminal 12. More specifically, the source of PMOS transistor 13 is connected to supply voltage VDD. The drain of PMOS transistor 14 is connected to output terminal 12. The drain of PMOS transistor 13 is connected to the source of PMOS transistor 14. Two NMOS transistors 15 and 16 are connected in series between ground voltage GND and output terminal 12. More specifically, the source of NMOS transistor 15 is connected to ground voltage GND. The drain of NMOS transistor 16 is connected to output terminal 12. The drain of NMOS transistor 15 is connected to the source of NMOS transistor 16.

Input terminal 11 and the gate of PMOS transistor 13 are connected to each other. Input terminal 11 and the gate of NMOS transistor 15 are connected to each other. PMOS transistor 13 and NMOS transistor 15 are common-source transistors.

Clamp circuit 17 is connected to the gate of PMOS transistor 14 and the gate of NMOS transistor 16. The drain of PMOS transistor 14 and the drain of NMOS transistor 16 are connected to output terminal 12. Clamp circuit 17 includes two switches 171 and 173 and two capacitors 172 and 174. Switch 171 is connected between bias voltage Vb1 and the gate of PMOS transistor 14. Capacitor 172 is connected between input terminal 11 and the gate of PMOS transistor 14. Switch 173 is connected between bias voltage Vb2 and the gate of NMOS transistor 16. Capacitor 174 is connected between input terminal 11 and the gate of NMOS transistor 16. PMOS transistor 14 and NMOS transistor 16 are cascode transistors.

Integrator 20A includes inverting amplifier 10A, input terminal 21, output terminal 22, two capacitors 23 and 25, and two switches 24 and 26. Capacitor 23 is connected between input terminal 21 and input terminal 11 of inverting amplifier 10A. Switch 24 is connected between input terminal 11 of inverting amplifier 10A and output terminal 12 of inverting amplifier 10A. Capacitor 25 and switch 26 are connected in series between input terminal 11 of inverting amplifier 10A and output terminal 12 of inverting amplifier 10A. Output terminal 12 of inverting amplifier 10A is connected to output terminal 22 of integrator 20A.

[1-2. Operations]

Operations performed by integrator 20A configured as described above are described hereinafter. Integrator 20A operates by alternately repeating a sampling phase and an integration phase.

In each sampling phase, switches 24, 171, and 173 close and switch 26 opens as illustrated in FIG. 1A. When switch 24 closes, input terminal 11 and output terminal 12 of inverting amplifier 10A are short-circuited. In this way, both of voltages of input terminal 11 and output terminal 12 of inverting amplifier 10A change to a voltage (which is assumed to be midpoint voltage Vx) around the midpoint between supply voltage VDD and ground voltage GND. At this time, the voltage of input terminal 21 of integrator 20A is assumed to be Vo. Charge corresponding to Vo−Vx is accumulated to capacitor 23 in the sampling phase. In other words, capacitor 23 functions as a sampling capacitor.

When switch 26 opens, capacitor 25 is disconnected from input terminal 11 of inverting amplifier 10A. For this reason, either the voltage of input terminal 11 of inverting amplifier 10A or the voltage of output terminal 12 of inverting amplifier 10A changes, the amount of charge accumulated in capacitor 25 is maintained.

When switch 171 closes, bias voltage Vb1 is applied to the gate of PMOS transistor 14. In this way, charge corresponding to Vb1−Vx is accumulated in capacitor 172. When switch 173 closes, bias voltage Vb2 is applied to the gate of NMOS transistor 16. In this way, charge corresponding to Vb2−Vx is accumulated in capacitor 174.

In each integration phase, the open—close states of switches 24, 26, 171, and 173 are opposite to those in each sampling phase. In other words, switches 24, 171, and 173 open, and switch 26 closes as illustrated in FIG. 1B. When switch 24 opens, input terminal 11 and output terminal 12 of inverting amplifier 10A change from a short-circuit state to an open state. Inverting amplifier 10A inversely amplifies the signal input to input terminal 11, and outputs the amplified signal from output terminal 12. When switch 26 closes, capacitor 25 is connected between input terminal 11 and output terminal 12 of inverting amplifier 10A.

Here, in the integration phase, the input signal is input to input terminal 21, which changes the voltage of input terminal 21 from Vo to Vin stepwise. The amplification rate of inverting amplifier 10A is sufficiently large. Thus, the variation in the amount of voltage of input terminal 21, that is, charge corresponding to Vin−Vo is accumulated in capacitor 25. In other words, capacitor 25 functions as an integrating capacitor for integrating the input signal.

Here, the variation in the amount of voltage to be input to input terminal 21 in the integration phase is assumed to be ΔVin (=Vin−Vo). The variation in the amount of voltage Vout to be output from output terminal 22 is assumed to be ΔVout. The value indicating the capacitance of capacitor 23 is assumed to be Cs. The value indicating the capacitance of capacitor 25 is assumed to be Ci. At this time, the following expression is satisfied.

$$\Delta Vout = -Cs/Ci \times \Delta Vin$$

Output voltage Vout of integrator 20A is changed by ΔVout by alternately repeating a sampling phase and an integration phase, and thus integrator 20A can perform the integration operations.

Here, a description is given of a case where switch 26 is always ON in integrator 20A. In each sampling phase, since switch 26 is ON, charge accumulated in capacitor 25 is released through switches 24 and 26. In this way, the voltage across capacitor 25 is reset in the sampling phase. In other words, at the time of switching from the sampling phase to the next integration phase, the voltage across capacitor 25 is already reset. In this way, the integration operation in the integration phase is performed substantially as a sample and hold operation for holding the input signal. As described above, by means of switch 26 being always ON, it is possible to cause integrator 20A to function as a sample hold circuit which holds the input signal. At this time, in a steady state in the integration phase, the voltage across capacitor 25 is maintained at ΔVout. In other words, Vout which is the voltage of output terminal 22 of integrator 20A is calculated from Vx−ΔVout.

It is to be noted that when integrator 20A is a sample hold circuit, it is also good to exclude switch 26 and to connect capacitor 25 between input terminal 11 of inverting amplifier 10A and output terminal 12 of inverting amplifier 10A.

Next, a description is given of the time when the sampling phase is switched to the integration phase. At this time, the voltage to be input to input terminal 21 starts to change from Vo to Vin stepwise. The change in the voltage of input terminal 21 propagates to the gate of PMOS transistor 13 and the gate of NMOS transistor 15 through capacitor 23.

As illustrated in FIG. 1A, in the sampling phase, switches 171 and 173 are closed, and the voltage of the gate of PMOS transistor 14 is fixed at bias voltage Vb1. Likewise, the voltage of the gate of NMOS transistor 16 is fixed at bias voltage Vb2.

On the other hand, in the integration phase, switches 171 and 173 are open, and the voltages at the gate of PMOS transistor 14 and the gate of NMOS transistor 16 are not fixed. The gate of PMOS transistor 14 is connected to input terminal 11 of inverting amplifier 10A through capacitor 172. The gate of NMOS transistor 16 is connected to input terminal 11 through capacitor 174.

Here, the voltage across capacitor 172 in the sampling phase is assumed to be Vc1 (=Vb1−Vx). The voltage across capacitor 174 in the sampling phase is assumed to be Vc2 (=Vb2−Vx). At this time, the voltage of the gate of PMOS transistor 14 at the time of switching to the integration phase is Vin+Vc1. Likewise, the voltage of the gate of NMOS transistor 16 is Vin+Vc2. In this way, the voltages of the gate of PMOS transistor 14 and the gate of NMOS transistor 16 increase and decrease according to the voltage of input terminal 11 of inverting amplifier 10A. In other words, the voltages to be applied to the gate of PMOS transistor 14 and the gate of NMOS transistor 16 are clamped by clamp circuit 17.

For example, when Vin>Vo is satisfied, clamp circuit 17 decreases current between the source and drain of PMOS transistors 13 and 14, and increases current between the source and drain of NMOS transistors 15 and 16. In this way, inverting amplifier 10A can draw larger current from output terminal 12. In other words, the drive power of inverting amplifier 10A is increased.

On the other hand, when Vin<Vo is satisfied, clamp circuit 17 increases current between the source and drain of PMOS transistors 13 and 14, and decreases current between the source and drain of NMOS transistors 15 and 16. In this way, inverting amplifier 10A can output larger current to output terminal 12. In other words, the drive power of inverting amplifier 10A is increased.

In integrator 20A including inverting amplifier 10A according to the present disclosure, the drive power of inverting amplifier 10A increases when an input signal is input in each integration phase. This accelerates change in voltage Vout of output terminal 22, which reduces the time required for the voltage of output terminal 22 to reach a steady state. In other words, the large-signal characteristics of integrator 20A are improved.

Figure 10:
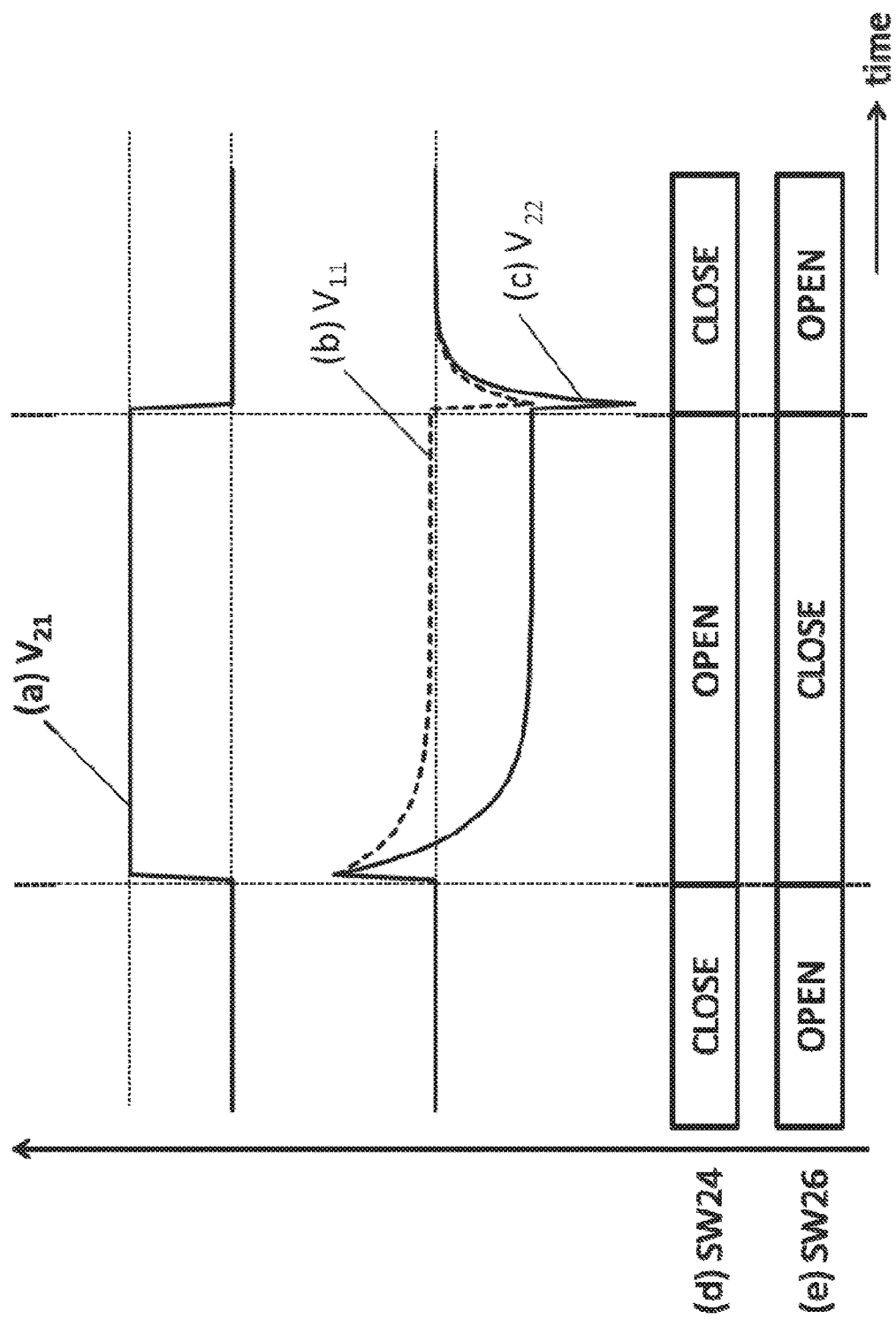
FIG. 10 is a waveform diagram indicating operations performed by an integrator according to Embodiment 1.

FIG. 10 is a waveform diagram schematically illustrating examples of operations performed by integrator 20A including inverting amplifier 10A. V21 of (a) shows a voltage waveform in input terminal 21. V11 of (b) shows a voltage waveform in input terminal 11 of inverting amplifier 10A. V22 of (c) shows a voltage waveform in output terminal 22. SW24 of (d) shows open and close timings of switch 24. SW26 of (e) shows open and close timings of switch 26.

[1-3. Effects Etc.]

As described above, in Embodiment 1, inverting amplifier 10A includes input terminal 11, output terminal 12, PMOS transistor 13, PMOS transistor 14, NMOS transistor 15, NMOS transistor 16, and clamp circuit 17. Input terminal 11 is an input terminal to which an input signal is input. Output terminal 12 is an output terminal from which an output signal is output. PMOS transistors 13 and 14 are connected in series between supply voltage VDD and output terminal 12. NMOS transistors 15 and 16 are connected in series between ground voltage GND and output terminal 12. PMOS transistor 14 and NMOS transistor 16 are connected to output terminal 12. Clamp circuit 17 is connected to the gate of PMOS transistor 14 and the gate of NMOS transistor 16. Clamp circuit 17 includes switch 171, capacitor 172, switch 173, and capacitor 174. Switch 171 is connected between bias voltage Vb1 and the gate of PMOS transistor 14. Capacitor 172 is connected between input terminal 11 and the gate of PMOS transistor 14. Switch 173 is connected between bias voltage Vb2 and the gate of NMOS transistor 16. Capacitor 174 is connected between input terminal 11 and the gate of NMOS transistor 16. The gate of PMOS transistor 13 and the gate of NMOS transistor 15 are connected to input terminal 11 to allow an input signal to pass through.

In addition, in Embodiment 1, integrator 20A includes above-described inverting amplifier 10A, input terminal 21, capacitor 23, switch 24, capacitor 25, and switch 26. Input terminal 21 is an input terminal to which an input signal is input. Capacitor 23 is connected between input terminal 21 and input terminal 11 of inverting amplifier 10A. Switch 24 is connected between input terminal 11 of inverting amplifier 10A and output terminal 12 of inverting amplifier 10A. Capacitor 25 and switch 26 are connected in series between input terminal 11 of inverting amplifier 10A and output terminal 12 of inverting amplifier 10A.

Inverting amplifier 10A according to Embodiment 1 includes PMOS transistor 14 and NMOS transistor 16 which are cascode transistors. In this way, it is possible to increase the amplification rate of inverting amplifier 10A. With inverting amplifier 10A according to Embodiment 1, it is possible to increase and decrease voltages of the gate of PMOS transistor 14 and the gate of NMOS transistor 16, according to voltages of input signals to be input to input terminal 11. In this way, when NMOS transistor 15 is driven to increase current, NMOS transistor 16 also operates to increase current. In addition, when PMOS transistor 13 is driven to increase current, PMOS transistor 14 also operates to increase current. In this way, decrease in drive power of inverting amplifier 10A caused by NMOS transistor 16 and PMOS transistor 14 is improved. As described above, it is possible to configure a compact low-power inverting amplifier which inversely amplifies an input signal at high speed.

In addition, with inverting amplifier 10A, integrator 20A is capable of performing low-power, high-speed, and highly accurate integration operations.

Figure 3:
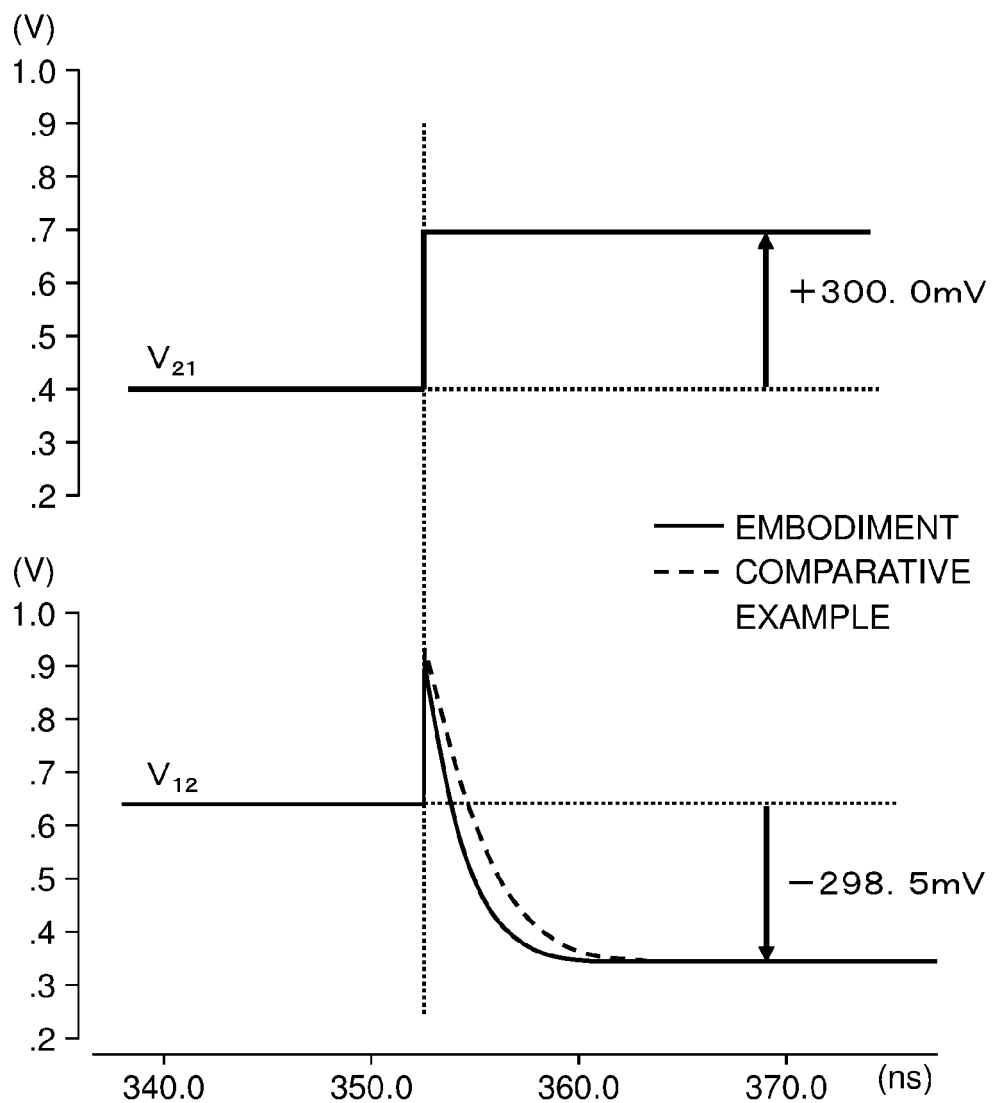
FIG. 3 is a graph showing examples of output waveforms before and after rises of input signals in the integrator in a comparative example and in the integrator according to Embodiment 1.

Effects provided by Embodiment 1 are described with reference to the result of a circuit simulation. Regarding integrator 20A according to Embodiment 1 and an integrator in a comparative example, each of FIGS. 2 and 3 illustrates a waveform (shown as V21) of an input signal which changes stepwise and a waveform (shown as V12) of an output signal to the input signal. FIG. 2 is a graph showing an example of the output waveform before and after a fall of the input signal (the voltage input to input terminal 21 changes from Vo (700 mV) to Vin (400 mV) by −300 mV stepwise). FIG. 3 is a graph showing an example of the output waveform before and after a rise of the input signal (the voltage input to input terminal 21 changes from Vo (400 mV) to Vin (700 mV) by −300 mV stepwise). In FIG. 2, the waveform (V12) of the output signal converges to +298.1 mV while +300 mV is an ideal value. In FIG. 3, the waveform (V12) of the output signal converges to −298.5 mV while −300 mV is an ideal value. In this way, since the gain of inverting amplifier 10A according to Embodiment 1 is high, it is possible to converge the output signal with high accuracy.

It is to be noted that the integrator in the comparative example here is obtained by replacing inverting amplifier 10A in integrator 20A with an inverting amplifier in the comparative example. The inverting amplifier in the comparative example here is an inverting amplifier obtained by removing clamp circuit 17 from inverting amplifier 10A, and applying a fixed bias voltage to cascode transistors (PMOS transistor 14 and NMOS transistor 16).

As is known from FIGS. 2 and 3, inverting amplifier 10A according to Embodiment 1 provides a gain of approximately 50 dB which is equivalent to a gain provided by the inverting amplifier in the comparative example. Furthermore, inverting amplifier 10A according to Embodiment 1 outputs an output signal having sharp rise and fall waveforms compared to the rise and fall waveforms output by the inverting amplifier in the comparative example. In this way, settling time for integrator 20A is reduced to approximately ⅔. As described above, the use of inverting amplifier 10A according to Embodiment 1 makes it possible to increase the settling speed to approximately 1.5 times while maintaining the gain.

Embodiment 2

Hereinafter, Embodiment 2 is described with reference to FIGS. 4A and 4B.

[2-1. Configuration]

Figure 4A:
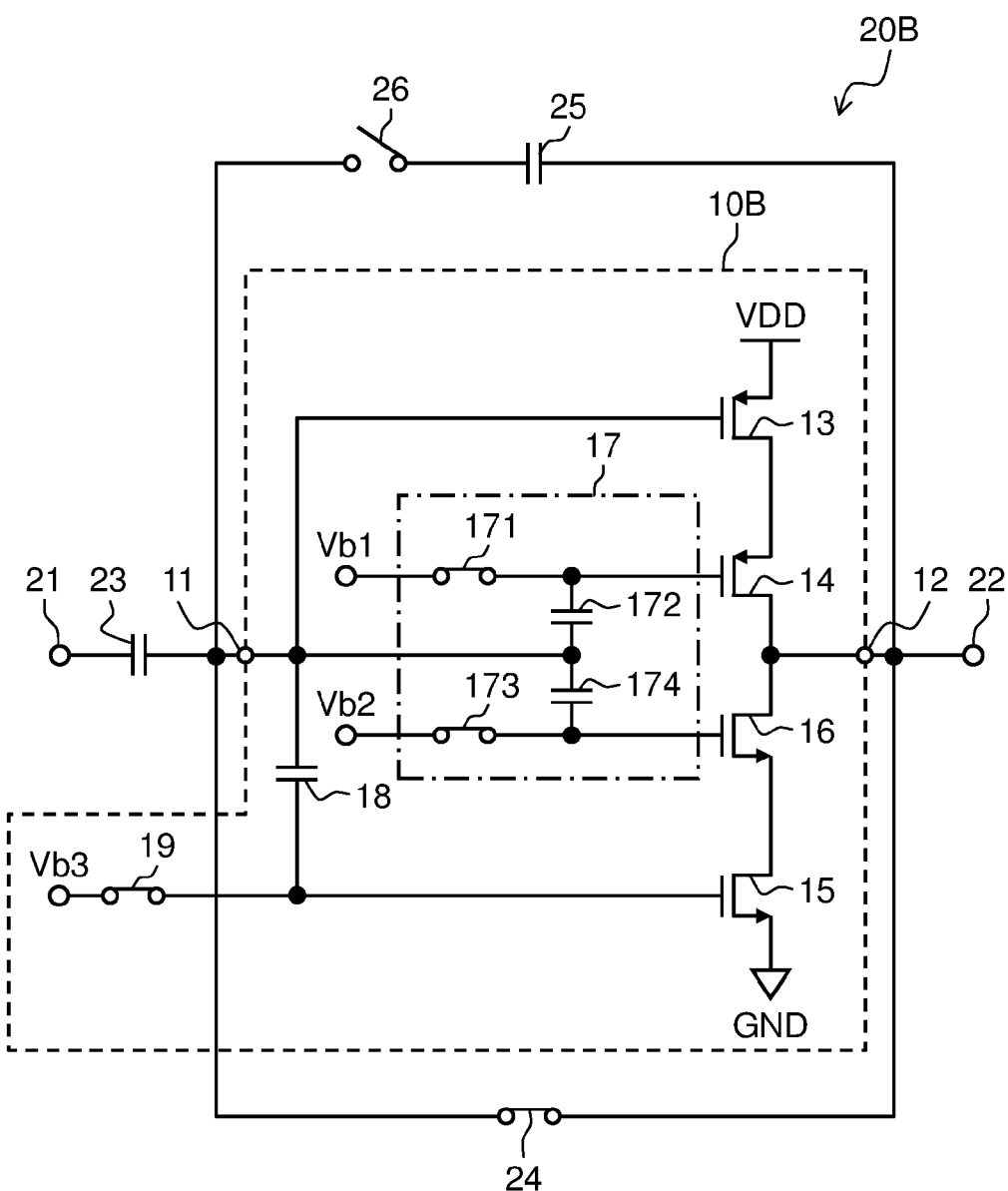
FIG. 4A is a circuit diagram illustrating an example of an integrator in a sampling phase which includes an inverting amplifier according to Embodiment 2.

FIG. 4A is a circuit diagram illustrating an example of an integrator in a sampling phase which includes an inverting amplifier according to Embodiment 2. FIG. 4B is a circuit diagram illustrating the integrator in FIG. 4A in an integration phase.

Figure 4B:
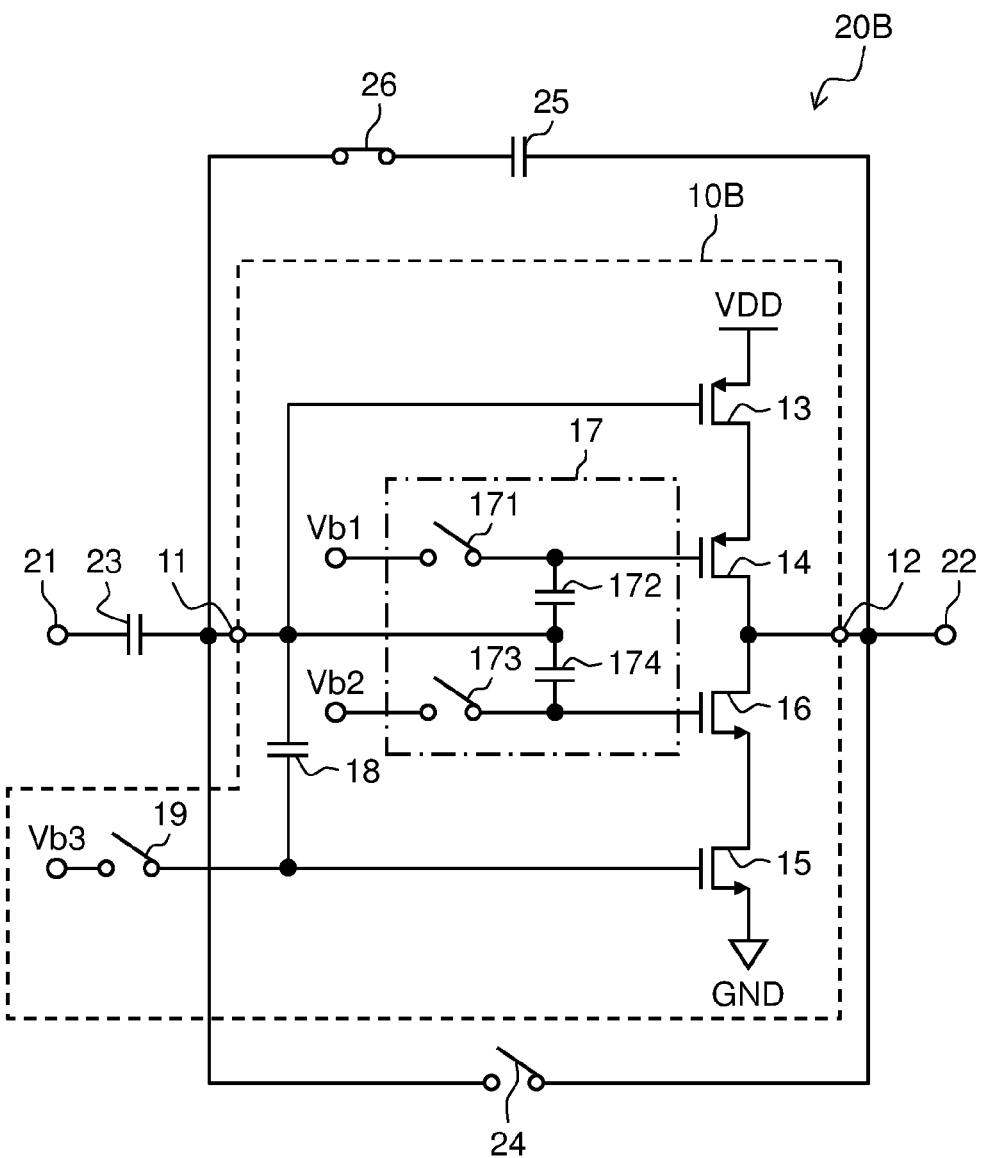
FIG. 4B is a circuit diagram illustrating the integrator in FIG. 4A in an integration phase.

As illustrated in FIGS. 4A and 4B, inverting amplifier 10B includes input terminal 11, output terminal 12, two PMOS transistors 13 and 14, two NMOS transistors 15 and 16, clamp circuit 17, capacitor 18, and switch 19. Two PMOS transistors 13 and 14 are connected in series between supply voltage VDD and output terminal 12. More specifically, the source of PMOS transistor 13 is connected to supply voltage VDD. The drain of PMOS transistor 14 is connected to output terminal 12. The drain of PMOS transistor 13 is connected to the source of PMOS transistor 14. Two NMOS transistors 15 and 16 are connected in series between ground voltage GND and output terminal 12. More specifically, the source of NMOS transistor 15 is connected to ground voltage GND. The drain of NMOS transistor 16 is connected to output terminal 12. The drain of NMOS transistor 15 is connected to the source of NMOS transistor 16.

The gate of PMOS transistor 13 is connected to input terminal 11. Capacitor 18 is connected between input terminal 11 and the gate of NMOS transistor 15. In other words, input terminal 11 and the gate of NMOS transistor 15 are connected to each other via capacitor 18. Switch 19 is connected between bias voltage Vb3 and the gate of NMOS transistor 15. PMOS transistor 13 and NMOS transistor 15 are common-source transistors.

Clamp circuit 17 is connected to the gate of PMOS transistor 14 and the gate of NMOS transistor 16. PMOS transistor 14 and NMOS transistor 16 are connected to output terminal 12. Clamp circuit 17 includes two switches 171 and 173 and two capacitors 172 and 174. Switch 171 is connected between bias voltage Vb1 and the gate of PMOS transistor 14. Capacitor 172 is connected between input terminal 11 and the gate of PMOS transistor 14. Switch 173 is connected between bias voltage Vb2 and the gate of NMOS transistor 16. Capacitor 174 is connected between input terminal 11 and the gate of NMOS transistor 16. PMOS transistor 14 and NMOS transistor 16 are cascode transistors.

Integrator 20B includes inverting amplifier 10B, input terminal 21, output terminal 22, two capacitors 23 and 25, and two switches 24 and 26. Capacitor 23 is connected between input terminal 21 and input terminal 11 of inverting amplifier 10B. Switch 24 is connected between input terminal 11 of inverting amplifier 10B and output terminal 12 of inverting amplifier 10B. Capacitor 25 and switch 26 are connected in series between input terminal 11 of inverting amplifier 10B and output terminal 12 of inverting amplifier 10B. Output terminal 12 of inverting amplifier 10B is connected to output terminal 22 of integrator 20B.

[2-2. Operations]

Operations performed by integrator 20B configured as described above are described hereinafter. It is to be noted that the same elements and functions as in Embodiment 1 are not repeatedly described.

In each sampling phase, switches 19, 24, 171, and 173 close and switch 26 opens as illustrated in FIG. 4A.

When switch 19 closes, bias voltage Vb3 is applied to the gate of NMOS transistor 15. For this reason, NMOS transistor 15 operates as a constant current source for maintaining current between the source and drain of NMOS transistor 15 at a certain level. In this way, it is possible to change, to constant current, current flowing from VDD to GND via PMOS transistors 13 and 14 and NMOS transistors 16 and 15. Charge corresponding to Vx−Vb3 is accumulated to capacitor 18 in the sampling phase.

It is to be noted that bias voltage Vb3 can be set according to a process, a supply voltage, a temperature, etc. In this way, even when the process, the supply voltage, the temperature etc. vary, it is possible to control the source—drain current of NMOS transistor 15 to be constant.

The gate of PMOS transistor 13 is connected to input terminal 11 of inverting amplifier 10B as in Embodiment 1. In this way, in the sampling phase in which switch 24 closes, voltages of input terminal 11 and output terminal 12 of inverting amplifier 10B are voltage Vx which is a midpoint between supply voltage VDD and ground voltage GND.

In each integration phase, the open—close states of switches 19, 24, 26, 171, and 173 are opposite to those in the sampling phase. In other words, switches 19, 24, 171, and 173 open, and switch 26 closes as illustrated in FIG. 4B.

With switch 19 open, charge accumulated in capacitor 18 is maintained also in the integration phase. In this way, in steady states in both of the sampling phase and the integration phase, it is possible to maintain source—drain current of NMOS transistor 15 to be constant.

[2-3. Effects Etc.]

According to Embodiment 2, it is possible to configure compact low-power inverting amplifier 10B which inversely amplifies an input signal at high speed. In addition, with such inverting amplifier 10B, integrator 20B is capable of performing low-power, high-speed, and highly accurate integration operations.

With inverting amplifier 10B according to Embodiment 2, it is possible to increase constant current characteristics of NMOS transistor 15. In this way, it is possible to maintain direct current to be constant irrespective of variation in process, supply voltage, temperature, etc., which contributes to improvement in yield.

Embodiment 3

Hereinafter, Embodiment 3 is described with reference to FIGS. 5A and 5B.

[3-1. Configuration]

Figure 5A:
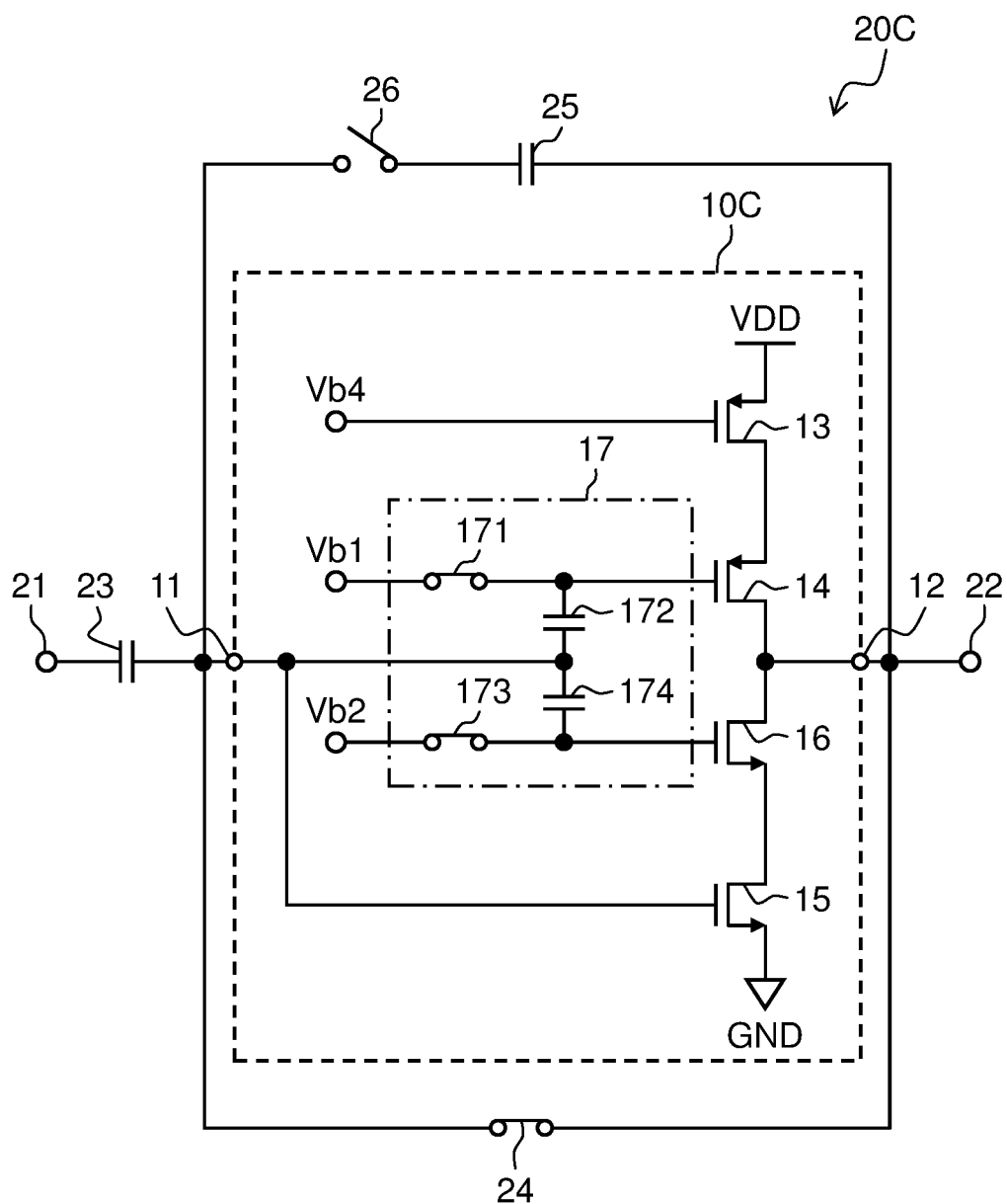
FIG. 5A is a circuit diagram illustrating an example of an integrator in a sampling phase which includes an inverting amplifier according to Embodiment 3.

FIG. 5A is a circuit diagram illustrating an example of an integrator in a sampling phase which includes an inverting amplifier according to Embodiment 3. FIG. 5B is a circuit diagram illustrating the integrator in FIG. 5A in an integration phase.

Figure 5B:
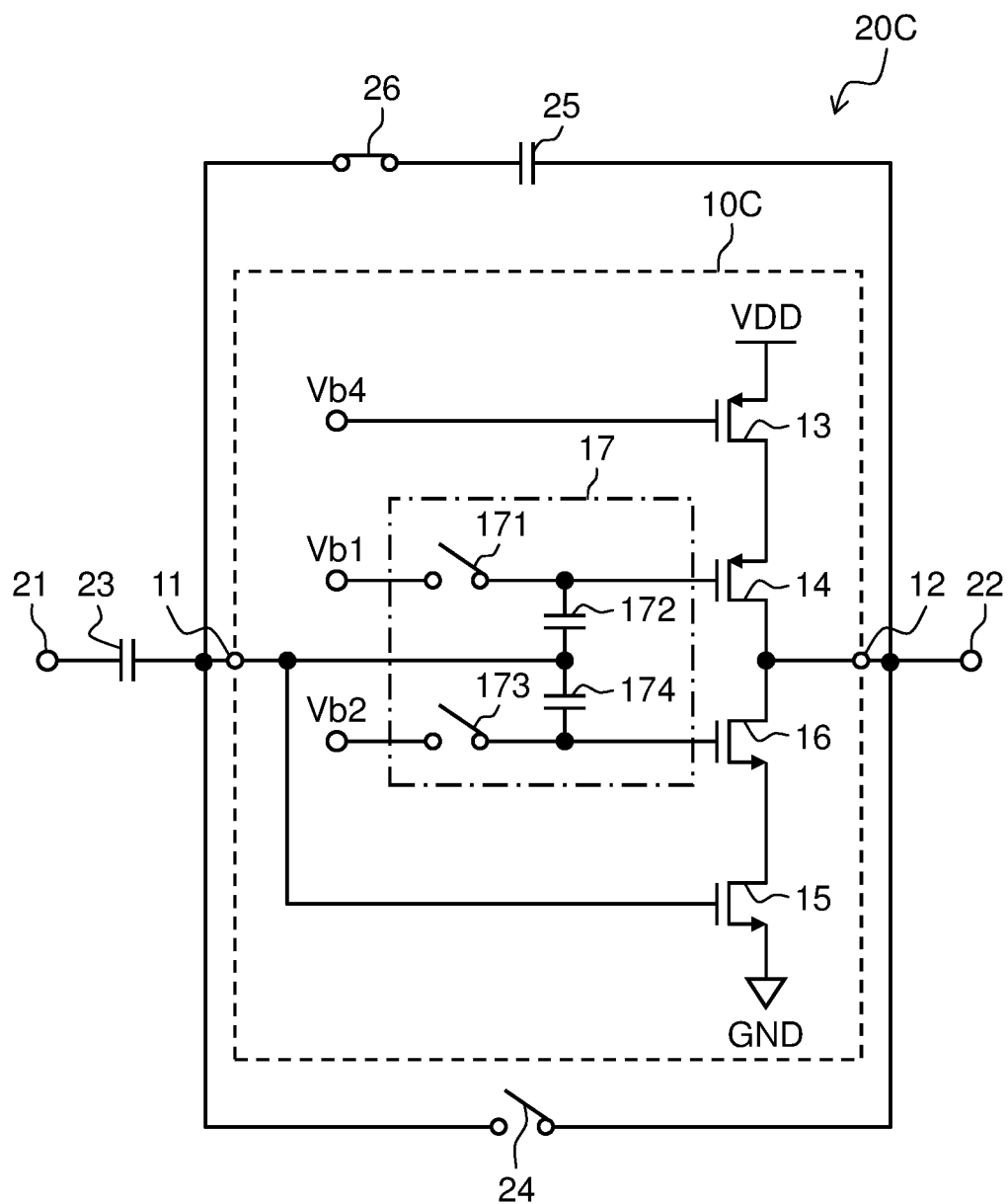
FIG. 5B is a circuit diagram illustrating the integrator in FIG. 5A in an integration phase.

As illustrated in FIGS. 5A and 5B, inverting amplifier 10C includes input terminal 11, output terminal 12, two PMOS transistors 13 and 14, two NMOS transistors 15 and 16, and clamp circuit 17. Two PMOS transistors 13 and 14 are connected in series between supply voltage VDD and output terminal 12. More specifically, the source of PMOS transistor 13 is connected to supply voltage VDD. The drain of PMOS transistor 14 is connected to output terminal 12. The drain of PMOS transistor 13 is connected to the source of PMOS transistor 14. Two NMOS transistors 15 and 16 are connected in series between ground voltage GND and output terminal 12. More specifically, the source of NMOS transistor 15 is connected to ground voltage GND. The drain of NMOS transistor 16 is connected to output terminal 12. The drain of NMOS transistor 15 is connected to the source of NMOS transistor 16.

Bias voltage Vb4 is connected to the gate of PMOS transistor 13. The gate of NMOS transistor 15 is connected to input terminal 11. NMOS transistor 15 is a common-source transistor.

Clamp circuit 17 is connected to the gate of PMOS transistor 14 and the gate of NMOS transistor 16. PMOS transistor 14 and NMOS transistor 16 are connected to output terminal 12. Clamp circuit 17 includes two switches 171 and 173 and two capacitors 172 and 174. Switch 171 is connected between bias voltage Vb1 and the gate of PMOS transistor 14. Capacitor 172 is connected between input terminal 11 and the gate of PMOS transistor 14. Switch 173 is connected between bias voltage Vb2 and the gate of NMOS transistor 16. Capacitor 174 is connected between input terminal 11 and the gate of NMOS transistor 16. PMOS transistor 14 and NMOS transistor 16 are cascode transistors.

Integrator 20C includes inverting amplifier 10C, input terminal 21, output terminal 22, two capacitors 23 and 25, and two switches 24 and 26. Capacitor 23 is connected between input terminal 21 and input terminal 11 of inverting amplifier 10C. Switch 24 is connected between input terminal 11 of inverting amplifier 10C and output terminal 12 of inverting amplifier 10C. Capacitor 25 and switch 26 are connected in series between input terminal 11 of inverting amplifier 10C and output terminal 12 of inverting amplifier 10C. Output terminal 12 of inverting amplifier 10C is connected to output terminal 22 of integrator 20C.

[3-2. Operations]

Operations performed by integrator 20C configured as described above are described hereinafter. Integrator 20C operates by alternately repeating a sampling phase and an integration phase. It is to be noted that the same elements and functions as in Embodiment 1 or Embodiment 2 are not repeatedly described.

In each sampling phase, switches 24, 171, and 173 close and switch 26 opens as illustrated in FIG. 5A. When switch 24 closes, input terminal 11 and output terminal 12 of inverting amplifier 10C are short-circuited. In this way, voltages of input terminal 11 and output terminal 12 of inverting amplifier 10C change to midpoint voltage Vx between supply voltage VDD and ground voltage GND.

At the time of switching from a sampling phase to an integration phase, the voltage to be input to input terminal 21 changes from Vo to Vin stepwise. At this time, the change in the voltage input to input terminal 21 propagates to the gate of NMOS transistor 15 through capacitor 23. On the other hand, the voltage of the gate of PMOS transistor 13 is constant at bias voltage Vb4.

It is to be noted that bias voltage Vb4 can be set according to a process, a supply voltage, a temperature, etc. In this way, even when the process, the supply voltage, the temperature etc. vary, it is possible to control the source—drain current of PMOS transistor 13 to be constant.

Bias voltage Vb4 is applied to the gate of PMOS transistor 13 in both of the sampling phase and the integration phase. In this way, PMOS transistor 13 operates as a constant current source in both of the sampling phase and the integration phase. In other words, in the steady states in both of the sampling phase and the integration phase, it is possible to maintain, to be constant, current flowing from VDD to GND via PMOS transistors 13 and 14 and NMOS transistors 16 and 15.

[3-3. Effects Etc.]

According to Embodiment 3, it is possible to configure compact low-power inverting amplifier 10C which inversely amplifies an input signal at high speed. In addition, with such inverting amplifier 10C, integrator 20C is capable of performing low-power, high-speed, and highly accurate integration operations.

In particular, in Embodiment 3, bias voltage Vb4 is always applied to the gate of PMOS transistor 13. In this way, in both of the sampling phase and the integration phase, current flowing from VDD to GND via PMOS transistors 13 and 14 and NMOS transistors 16 and 15 is maintained to be constant. In this way, it is possible to maintain direct current to be constant irrespective of variation in process, supply voltage, temperature, etc., which contributes to improvement in yield.

Embodiment 4

Hereinafter, Embodiment 4 is described with reference to FIG. 6.

Figure 6:
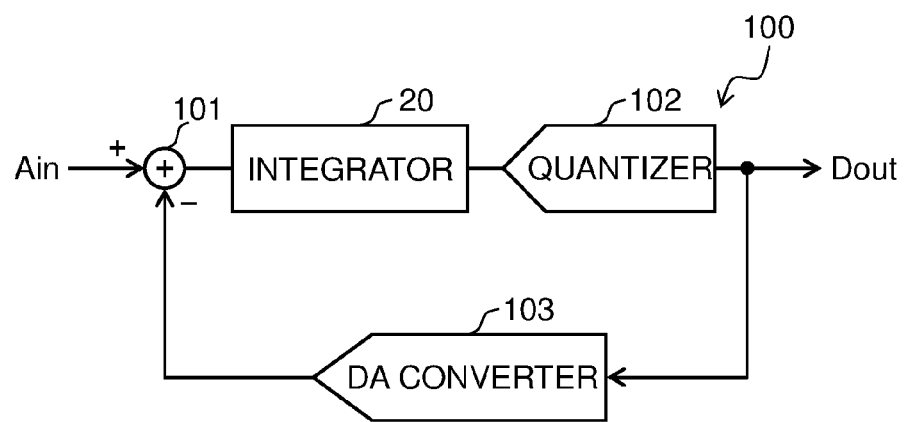
FIG. 6 is a block configuration diagram of an AD converter according to Embodiment 4.

FIG. 6 is a block configuration diagram of an AD converter according to Embodiment 4.

As illustrated in FIG. 6, AD converter 100 includes adder 101, integrator 20, quantizer 102, and DA converter 103. AD converter 100 is a $\Delta\Sigma$AD converter which converts analog signal Ain to digital signal Dout. Adder 101 generates a difference signal between analog signal Ain and an output signal of DA converter 103. Integrator 20 is configured to integrate the output signal of adder 101. Adder 20 is implemented using any one of integrators 20A, 20B, and 20C according to Embodiments 1 to 3. Quantizer 102 quantizes the output signal of integrator 20, and outputs digital signal Dout. DA converter 103 performs DA conversion on digital signal Dout, and outputs the converted analog signal.

AD converter 100 according to Embodiment 4 uses, as integrator 20, any one of integrators 20A, 20B, and 20C according to Embodiments 1 to 3. In this way, it is possible to perform low-power, high-speed, and highly accurate AD conversion operations.

Embodiment 5

Hereinafter, Embodiment 5 is described with reference to FIG. 7.

Figure 7:
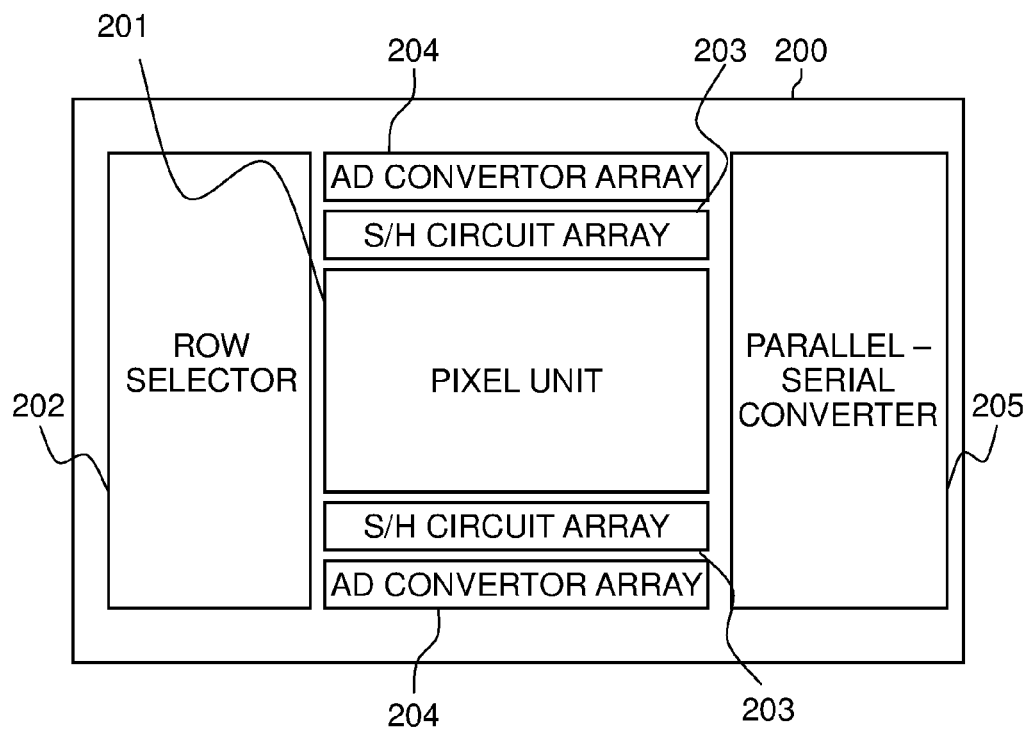
FIG. 7 is a block configuration diagram of an image sensor according to Embodiment 5.

FIG. 7 is a block configuration diagram of an image sensor according to Embodiment 5.

As illustrated in FIG. 7, image sensor 200 includes pixel unit 201, row selector 202, sample hold (S/H) circuit array 203, AD converter array 204, and parallel—serial converter 205. Pixel unit 201 includes a plurality of photo-electric conversion elements (for example, photodiodes) arranged in a matrix. Row selector 202 selects photo-electric conversion elements of an arbitrarily selected one row in pixel unit 201.

Sample hold circuit array 203 and AD converter array 204 are arranged at both sides of pixel unit 201. Sample hold circuit array 203 includes several thousands of sample hold circuits. Each of the sample hold circuits holds output power of corresponding ones of photo-electric conversion elements in the photo-electric conversion elements of the row selected by row selector 202. As a sample hold circuit in sample hold circuit array 203, it is possible to use a sample hold circuit obtainable by modifying any one of integrators 20A, 20B, and 20C according to Embodiments 1 to 3 (to remove or always turn on switch 26).

AD converter array 204 includes several thousands of AD converters. Each of the AD converters performs AD conversion on an output voltage of corresponding one of sample hold circuits included in sample hold circuit array 203. As an AD converter in AD converter array, it is possible to use AD converter 100 according to Embodiment 4.

Parallel—serial converter 205 converts a digital signal (parallel signal) output from AD converter array 204 to a serial signal. Image sensor 200 outputs the converted serial signal.

In general, the number of pixels of an imaging element mounted on a CMOS image sensor is limited by the photo-electric conversion elements used in pixel unit 201. The number of pixels of an imaging element mounted on a CMOS image sensor is further limited by power consumed by the AD converter.

Image sensor 200 according to Embodiment 5 includes any one of integrators 20A, 20B, and 20C according to Embodiments 1 to 3, as each of sample hold circuits in sample hold circuit array 203. In this way, image sensor 200 can perform high-speed operations while maintaining accuracy. Thus, it is possible to increase the number of pixels, and achieve a higher frame rate.

Image sensor 200 according to Embodiment 5 uses AD converter 100 according to Embodiment 4, as each of the AD converters of AD converter array 204. In this way, image sensor 200 can perform high-speed operations while maintaining accuracy. Thus, it is possible to increase the number of pixels, and achieve a higher frame rate.

Embodiment 6

Hereinafter, Embodiment 6 is described with reference to FIG. 8.

Figure 8:
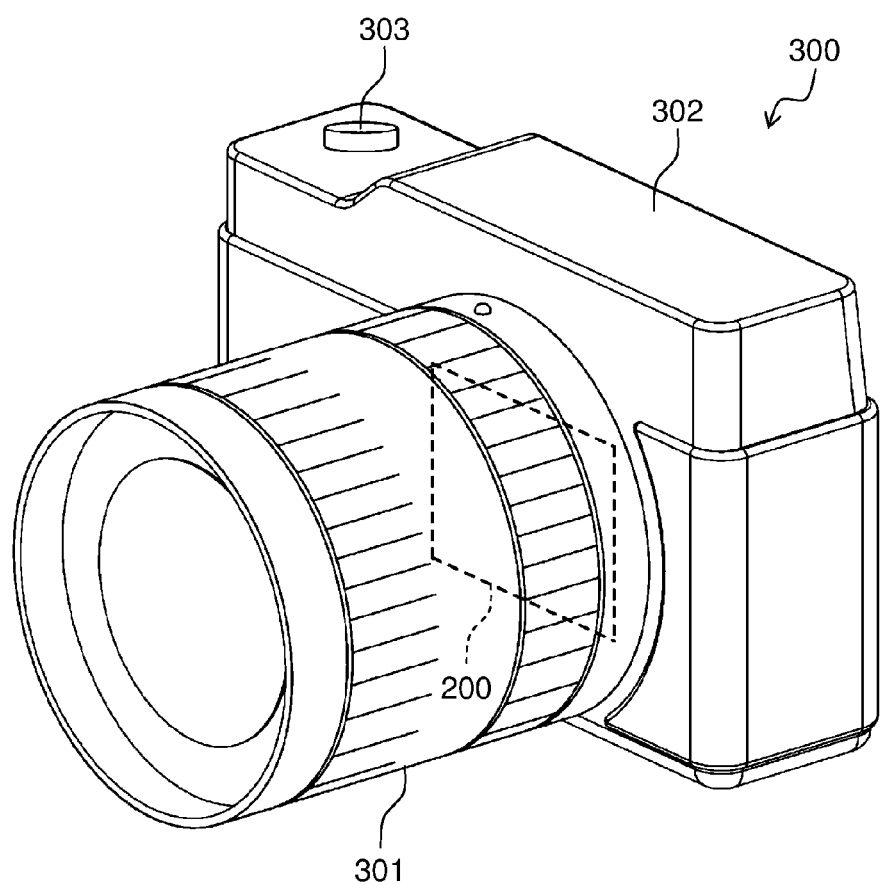
FIG. 8 is an external view of a digital camera according to Embodiment 6.

FIG. 8 is an external view of a digital camera according to Embodiment 6. As illustrated in FIG. 8, digital camera 300 includes interchangeable lens (an optical system for imaging) 301, and camera body 302 which can mount interchangeable lens 301. Interchangeable lens 301 includes a focus lens and a zoom lens (not illustrated in the drawings). Camera body 302 includes release button 303. Camera body 302 includes image sensor 200 according to Embodiment 5.

Hereinafter, operations by digital camera 300 illustrated in FIG. 8 are described briefly.

Upon receiving a half-press on release button 303 performed by a user, camera body 302 transmits a control signal for causing an automatic focus operation to interchangeable lens 301. In addition, upon receiving a full-press on release button 303 performed by the user, camera body 302 executes an operation of imaging a subject formed through interchangeable lens 301.

Interchangeable lens 301 collects light from the subject to form the image on image sensor 200. Image sensor 200 receives the formed image of the subject, and performs photo-electric conversion on the image of the subject to generate image data. The image data is processed by a processor (not illustrated) in camera body 302.

As illustrated in Embodiment 6, digital camera 300 includes image sensor 200 according to Embodiment 5, and is thus capable of capturing a high-quality image with low power consumption.

Other Embodiments

Embodiments 1 to 6 have been described above as examples of techniques disclosed in the present application. However, the techniques in the present disclosure are not limited thereto, and are applicable to embodiments obtainable by arbitrarily performing modification, replacement, addition, omission, etc. In addition, it is also possible to obtain new embodiments by arbitrarily combining the constituent elements described in Embodiments 1 to 6.

As such, examples of other embodiments are described hereinafter.

In each of integrators 20A, 20B, and 20C according to Embodiments 1 to 3, switch 26 is connected to input terminal 11, and capacitor 25 is connected to output terminal 12. However, the connection pattern may be opposite. Specifically, capacitor 25 may be connected to input terminal 11, and switch 26 may be connected to output terminal 12.

In integrator 20B according to Embodiment 2, capacitor 18 and switch 19 are connected to the gate of NMOS transistor 15. However, this is a non-limiting example. For example, capacitor 18 and switch 19 may be connected to the gate of PMOS transistor 13, and input terminal 11 may be connected to the gate of NMOS transistor 15.

In integrator 20C according to Embodiment 3, bias voltage Vb4 is connected to the gate of PMOS transistor 13. However, this is a non-limiting example. For example, bias voltage Vb4 may be connected to the gate of NMOS transistor 15, and input terminal 11 may be connected to the gate of PMOS transistor 13.

In Embodiment 4, a ΔΣAD converter is illustrated as an AD converter including any one of integrators 20A, 20B, and 20C according to Embodiments 1 to 3. However, this is a non-limiting example. The AD converter according to Embodiment 4 may be a successive approximation AD converter, a pipeline AD converter, or the like.

In image sensor 200 according to Embodiment 5, sample hold circuit array 203 and AD converter array 204 are arranged at both sides of pixel unit 201. However, sample hold circuit array 203 and AD converter array 204 may be arranged at only one of the sides of pixel unit 201.

In Embodiment 6, digital camera 300 is listed as an example of an imaging apparatus which mounts image sensor 200. However, this is a non-limiting example. Image sensor 200 can be used for various kinds of apparatuses such as studio cameras, professional-use cameras, digital video cameras, monitoring cameras, on-vehicle cameras, smartphones, tablet PCs, etc.

Input terminal 11 of an inverting amplifier is a first input terminal. Output terminal 12 of the inverting amplifier is a first output terminal. Input terminal 21 of the inverting amplifier is a second input terminal. Output terminal 21 of the inverting amplifier is a second output terminal. The input signal to the inverting amplifier is a signal input from the first input terminal to the inverting amplifier. The output signal to the inverting amplifier is a signal output from the first output terminal.

PMOS transistor 13 is a first transistor. PMOS transistor 14 is a second transistor. NMOS transistor 15 is a third transistor. NMOS transistor 16 is a fourth transistor. The first input terminal and at least one of the gate of the first transistor and the gate of the third transistor are connected to allow an input signal to pass through. Here, the connection for causing the input signal to pass through may be, for example, direct connection or connection via a capacitor.

Switch 171 is a first switch. Capacitor 172 is a first capacitor. Switch 173 is a second switch. Capacitor 174 is a second capacitor. Switch 19 is a third switch. Capacitor 18 is a third capacitor. Switch 24 is a fourth switch. Capacitor 23 is a fourth capacitor. Switch 26 is a fifth switch. Capacitor 25 is a fifth capacitor.

A first voltage terminal is a terminal for supplying power voltage VDD. A second voltage terminal is a terminal for supplying a ground voltage GND. A transistor having a first polarity is a PMOS transistor. A transistor having a second polarity is an NMOS transistor. It is to be noted that this relationship may be opposite. Specifically, the first voltage terminal may supply ground voltage GND, and the second voltage terminal may supply power voltage VDD. At this time, the transistor having the first polarity is an NMOS transistor, and the transistor having the second polarity is a PMOS transistor.

A third voltage terminal is a terminal for supplying bias voltage Vb1. A fourth voltage terminal is a terminal for supplying bias voltage Vb2. A fifth voltage terminal is a terminal for supplying bias voltage Vb3.

The embodiments have been described above as examples of techniques in the present disclosure. For this purpose, the attached drawings and detailed descriptions have been provided.

Accordingly, constituent elements illustrated in the drawings and described in the detailed descriptions include not only essential constituent elements required to solve problems but also inessential constituent elements which are provided for illustrating the techniques and not required to solve the problems. For this reason, the inessential constituent elements should not be determined as being essential elements, based directly on the fact that the inessential constituent elements are illustrated in the drawings and described in the detailed descriptions.

Since the embodiments are provided for illustrating the techniques in the present disclosure, it is possible to perform various kinds of modification, replacement, addition, omission, etc. within the scope of the claims and equivalents thereof.

The present disclosure is applicable to inverting amplifiers required to inversely amplify input signals at high speed. More specifically, the present disclosure is applicable to inverting amplifiers, integrators, AD converters, sample hold circuits, image sensors, and imaging apparatuses.

What is claimed is:

1. An inverting amplifier, comprising:
   a first input terminal to which an input signal is input;
   a first output terminal from which an output signal is output;
   a first transistor and a second transistor having a first polarity and connected in series between a first voltage node and the first output terminal;
   a third transistor and a fourth transistor having a second polarity and connected in series between a second voltage node and the first output terminal; and
   a clamp circuit connected to a gate of the second transistor and a gate of the fourth transistor both connected to the first output terminal,
   wherein the clamp circuit includes:
   a first switch connected between a third voltage node and the gate of the second transistor;
   a first capacitor connected between the first input terminal and the gate of the second transistor;
   a second switch connected between a fourth voltage node and the gate of the fourth transistor; and
   a second capacitor connected between the first input terminal and the gate of the fourth transistor, and
   wherein the first input terminal and at least one of a gate of the first transistor and a gate of the third transistor are connected to allow the input signal to pass through.

2. The inverting amplifier according to claim 1,
   wherein the first input terminal and the gate of the first transistor are connected to each other, and
   the first input terminal and the gate of the third transistor are connected to each other.

3. The inverting amplifier according to claim 1, further comprising:
   a third capacitor connected between the first input terminal and the gate of the third transistor; and
   a third switch connected between a fifth voltage node and the gate of the third transistor,
   wherein the first input terminal and the gate of the first transistor are connected to each other.

4. The inverting amplifier according to claim 1,
   wherein the gate of the first transistor is connected to a fifth voltage node, and
   the gate of the third transistor is connected to the first input terminal.

5. An integrator, comprising:
   the inverting amplifier according to claim 1;
   a second input terminal to which a signal is input;
   a fourth capacitor connected between the second input terminal and the first input terminal of the inverting amplifier;
   a fourth switch connected between the first input terminal of the inverting amplifier and the first output terminal of the inverting amplifier; and
   a fifth capacitor and a fifth switch connected in series between the first input terminal of the inverting amplifier and the first output terminal of the inverting amplifier.

6. A sample hold circuit, comprising:
   the inverting amplifier according to claim 1;
   a second input terminal to which a signal is input;
   a second output terminal which is connected to the first output terminal of the inverting amplifier and to which the signal is output;

a fourth capacitor connected between the second input terminal and the first input terminal of the inverting amplifier;

a fourth switch connected between the first input terminal of the inverting amplifier and the first output terminal of the inverting amplifier; and a fifth capacitor connected between the first input terminal of the inverting amplifier and the first output terminal of the inverting amplifier.

7. An AD converter, comprising the integrator according to claim 5.

8. An image sensor, comprising:

a pixel unit in which a plurality of photoelectric conversion elements are arranged in a matrix;

a sample hold circuit array which includes a plurality of sample hold circuits and holds output voltages corresponding to a row of pixels in the pixel unit; and an analog to digital (AD) converter array which includes a plurality of the AD converters according to claim 7 to which the output voltages held in the sample hold circuit array are input.

9. An image sensor, comprising:

a pixel unit in which a plurality of photoelectric conversion elements are arranged in a matrix;

a sample hold circuit array which includes a plurality of the sample hold circuits according to claim 6 and holds output voltages corresponding to a row of pixels in the pixel unit; and an analog to digital (AD) converter array which includes a plurality of AD converters to which the output voltages held in the sample hold circuit array are input.

10. An imaging apparatus, comprising:

an optical system for imaging; and an image sensor according to claim 8 which receives an image of a subject formed by the optical system for imaging.

11. An imaging apparatus, comprising:

an optical system for imaging; and an image sensor according to claim 9 which receives an image of a subject formed by the optical system for imaging.

* * * * *